(12) United States Patent
Gu et al.

(10) Patent No.: US 7,550,090 B2
(45) Date of Patent: Jun. 23, 2009

(54) OXYGEN PLASMA CLEAN TO REMOVE CARBON SPECIES DEPOSITED ON A GLASS DOME SURFACE

(75) Inventors: Quancheng Gu, Fremont, CA (US); Cheng-Hsiung Tsai, Cupertino, CA (US); John C. Forster, San Francisco, CA (US); Xiaoxi Guo, San Jose, CA (US); Larry Frazier, Brentwood, CA (US)

(73) Assignee: Applied Materials, Inc., Santa Clara, CA (US)

( * ) Notice: Subject to any disclaimer, the term of this patent is extended or adjusted under 35 U.S.C. 154(b) by 183 days.

(21) Appl. No.: 11/626,121

(22) Filed: Jan. 23, 2007

(65) Prior Publication Data

US 2008/0173326 A1 Jul. 24, 2008

(51) Int. Cl.
- B44C 1/22 (2006.01)
- B08B 9/00 (2006.01)
- C25F 1/00 (2006.01)

(52) U.S. Cl. .................... 216/67; 134/1.1; 134/22.1; 134/26; 134/31; 438/905; 438/906

(58) Field of Classification Search ............... 438/905, 438/906; 216/67; 134/1.1, 22.1, 26, 31
See application file for complete search history.

(56) References Cited

U.S. PATENT DOCUMENTS

| 5,460,689 | A | 10/1995 | Raaijmakers et al. |
| 5,679,215 | A | 10/1997 | Barnes et al. |
| 5,817,534 | A * | 10/1998 | Ye et al. ................. 438/10 |
| 6,537,622 | B2 | 3/2003 | Kuo et al. |
| 6,547,934 | B2 | 4/2003 | Cohen et al. |
| 6,569,257 | B1 | 5/2003 | Nguyen et al. |
| 6,767,836 | B2 | 7/2004 | San et al. |
| 6,872,322 | B1 | 3/2005 | Chow et al. |
| 6,881,276 | B2 | 4/2005 | Blonigan et al. |
| 6,902,629 | B2 | 6/2005 | Zheng et al. |
| 2004/0074869 | A1* | 4/2004 | Wang et al. ............. 216/63 |
| 2004/0103914 | A1 | 6/2004 | Cheng et al. |
| 2005/0133059 | A1 | 6/2005 | Chen et al. |
| 2006/0130873 | A1 | 6/2006 | Richardson et al. |
| 2006/0151002 | A1* | 7/2006 | Kumar .................... 134/1.1 |
| 2006/0191555 | A1 | 8/2006 | Yoshida et al. |

OTHER PUBLICATIONS

U.S. Appl. No. 09/076,589, filed May 12, 1998, entitled "Oxygen-Argon Gas Mixture for Precleaning in Vacuum Processing System".

* cited by examiner

*Primary Examiner*—Shamim Ahmed
(74) *Attorney, Agent, or Firm*—Patterson & Sheridan, LLP

(57) ABSTRACT

A method for in-situ cleaning of a dielectric dome surface having been used in pre-clean processes is provided. Carbon containing deposits are removed by providing a plasma of one or more oxidizing gases which react with the carbon containing films to form volatile carbon containing compounds.

22 Claims, 5 Drawing Sheets

OXYGEN PLASMA CLEAN TO REMOVE CARBON SPECIES DEPOSITED ON A GLASS DOME SURFACE

BACKGROUND OF THE INVENTION

1. Field of the Invention

Embodiments of the present invention generally relate to the fabrication of integrated circuits. More particularly, the embodiments relates to methods for cleaning carbon containing deposits from a substrate processing chamber.

2. Description of the Related Art

Pre-clean chambers are used in the semiconductor processing industry to remove oxide layers from surfaces of substrates which are to be exposed to layer deposition processes such as chemical vapor deposition. However, during such pre-cleaning processes, carbon containing compounds may escape the substrate and deposit as a film on components of a pre-cleaning chamber. Dielectric domes, such as glass domes, are used in some pre-clean chambers, and may need to be removed for cleaning of carbon deposits. Components that frequently have to be removed are generally provided in a process kit. System operators periodically replace the process kit during routine maintenance for cleaning or disposal. Components of the process kit that are adequately cleaned can be reinstated later.

As the film forms on the process kit surfaces, its density may change, resulting in stress on the film. This stress, along with differences in the coefficients of expansion of the materials in the film and the process kit surfaces, can result in delamination, or flaking, of the film from the surface of the process kit and contamination of the substrate being processed. Because these particles can seriously damage the substrates and/or cause defects to form on the substrates, the process kit is typically replaced after a conservative number of substrates have been cleaned in the system. However, replacement of the process kit is time consuming and reduces throughput of the system even if expensive components can be adequately cleaned outside the chamber.

Therefore, there exists a need to remove in situ the carbon containing film from components of the process kit, such as the dielectric dome, without having to remove the processing kit.

SUMMARY OF THE INVENTION

Embodiments of the present invention generally provide a method for removing carbon containing films deposited onto chamber parts during pre-clean processes. In one embodiment, the method comprises providing a process chamber having carbon deposits on inner surfaces of a dielectric dome, introducing a first gas comprising one or more oxidizing gases into the process chamber at a flow rate of between about 0.32 sccm/cm$^2$ (standard cubic centimeters per Minute per squared centimeter) and about 1.9 sccm/cm$^2$ while maintaining a first pressure in the process chamber of between about 2 mTorr and about 25 mTorr, providing a first RF power at a frequency of between about 5 MHz and about 20 MHz to a substrate support member disposed in the process chamber and providing a second RF power at a frequency of between about 400 KHz and about 10 MHz to inductive coils surrounding the dielectric dome while maintaining a plasma of the first gas to react the one or more oxidizing gases with the carbon deposits to produce volatile compounds comprising carbon, terminating the first RF power, second RF power, and the first gas, introducing a second gas comprising one or more reducing gases to the process chamber at a flow rate of between about 0.16 sccm/cm$^2$ and about 1.3 sccm/cm$^2$, while maintaining a second pressure in the process chamber of between about 5 mTorr and about 60 mTorr, providing the first RF power at a frequency of between about 5 MHz and about 20 MHz to the substrate support member and providing the second RF power at a frequency of between about 400 KHz and about 10 MHz to the inductive coils while maintaining a plasma of the second gas to react the one or more reducing gases with the one or more oxidizing gases not evacuated from the process chamber, evacuating the chamber, and terminating the first RF power, the second RF power, and the second gas.

In a further embodiment, the method comprises providing a process chamber having carbon deposits on inner surfaces of a dielectric dome, introducing a first gas comprising oxygen into the process chamber at a flow rate of between about 0.32 sccm/cm$^2$ and about 1.9 sccm/cm$^2$ while maintaining a first pressure in the process chamber of between about 2 mTorr and about 25 mTorr, providing a first RF power at a of about 13.6 MHz to a substrate support member disposed in the process chamber and providing a second RF power at a frequency of about 2 MHz to inductive coils surrounding the dielectric dome while maintaining a plasma of the first gas to react the one or more oxidizing gases with the carbon deposits to produce volatile compounds comprising carbon, terminating the first RF power, second RF power, and the first gas, introducing a second gas comprising helium to the process chamber at a flow rate of between about 0.16 sccm/cm$^2$ and about 1.3 sccm/cm$^2$, while maintaining a second pressure in the process chamber of between about 5 mTorr and about 60 mTorr, providing the first RF power at a frequency of about 13.6 MHz to the substrate support member and providing the second RF power at a frequency of about 2 MHz to the inductive coils while maintaining a plasma of the second gas to react the one or more reducing gases with the one or more oxidizing gases not evacuated from the process chamber, evacuating the chamber, and terminating the first RF power, the second RF power, and the second gas.

In a further embodiment, the method comprises cleaning a process chamber by providing a process chamber having carbon deposits on inner surfaces of a dielectric dome, introducing a first gas comprising oxygen into the process chamber at a flow rate of between about 0.32 sccm/cm$^2$ and about 1.9 sccm/cm$^2$ while maintaining a first pressure in the process chamber of between about 2 mTorr and about 25 mTorr, providing a first RF power at a of about 13.6 MHz to a substrate support member disposed in the process chamber and providing a second RF power at a frequency of about 2 MHz to inductive coils surrounding the dielectric dome while maintaining a plasma of the first gas to react the one or more oxidizing gases with the carbon deposits for between about 1 minute and about 10 minutes to produce volatile compounds comprising carbon, terminating the first RF power, second RF power, and the first gas, introducing a second gas comprising helium to the process chamber at a flow rate of between about 0.16 sccm/cm$^2$ and about 1.3 sccm/cm$^2$, while maintaining a second pressure in the process chamber of between about 5 mTorr and about 60 mTorr, providing the first RF power at a frequency of about 13.6 MHz to the substrate support member and providing the second RF power at a frequency of about 2 MHz to the inductive coils while maintaining a plasma of the second gas to react the one or more reducing gases with the one or more oxidizing gases not evacuated from the process chamber for between about 1 minute and about 10 minutes, evacuating the chamber, and terminating.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
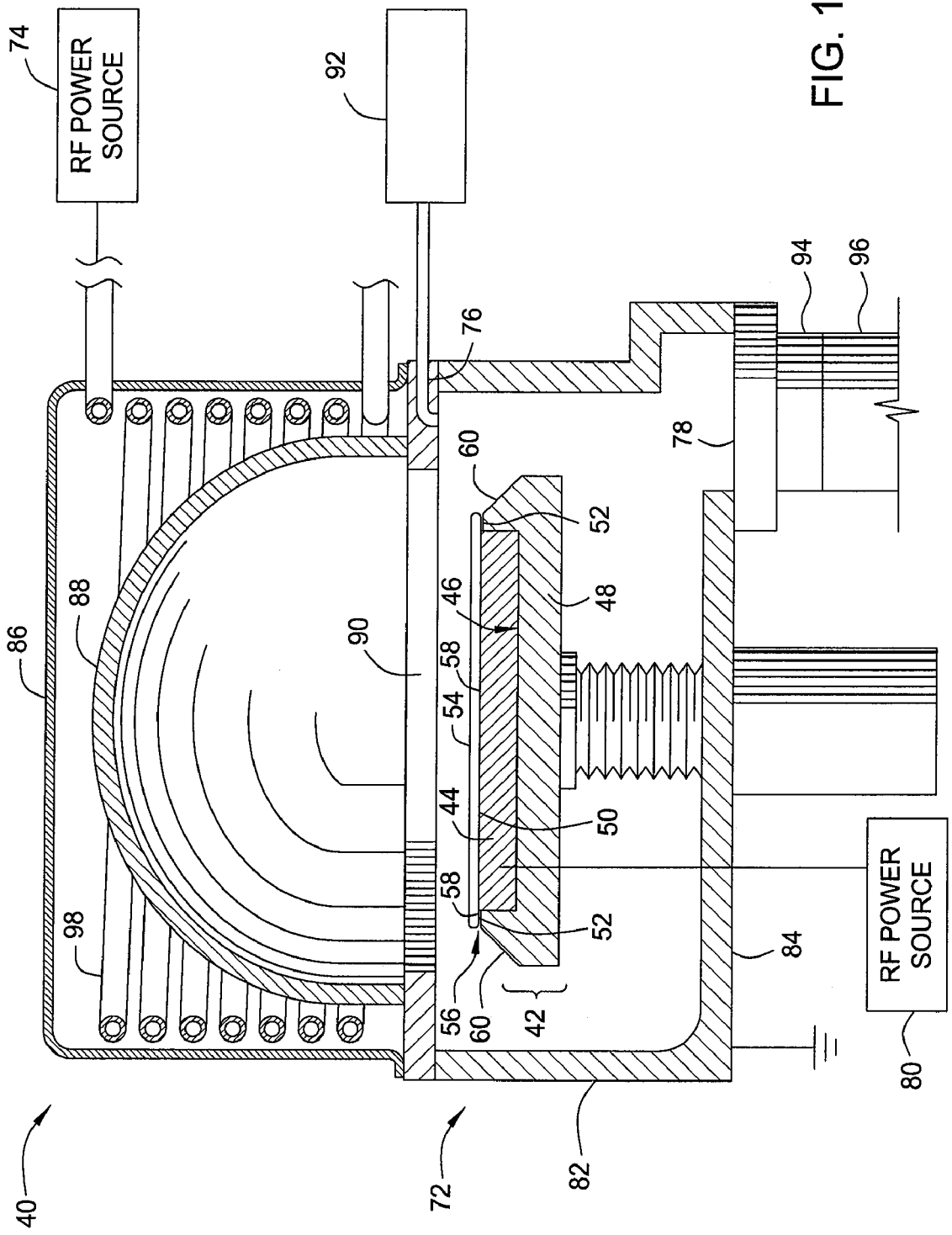
FIG. 1 is a cross sectional view of a pre-clean chamber.

FIG. 1 is a cross sectional view of a pre-clean chamber in which embodiments of the invention may be performed. Examples of systems that may be treated using the methods described herein are the Endura PVD system with a Preclean II chamber, both of which are available from Applied Materials, Inc., Santa Clara, Calif. Generally, the pre-clean chamber 40 comprises an enclosure 72, a substrate support 42 disposed within the chamber, a gas inlet 76 connected to the enclosure, a gas exhaust 78 connected to the enclosure, an RF power source 74 connected to an inductive coil 98 to generate a plasma within the enclosure, and a power source 80 connected to the substrate support member 42.

The enclosure 72 includes side walls 82, a bottom 84 and a top 86. A dielectric dome 88 is disposed under the top 86 and above a processing region 90. The dielectric dome 88 may be made from dielectric materials such as glass or quartz, and is typically part of a replaceable process kit that is replaced after a certain number of substrates have been processed in the chamber. An inductive coil 98 is disposed around the dielectric dome 88 and connected to an RF power source 74 to inductively couple a plasma within the processing region 90.

The gas inlet 76 is connected to a processing gas supply 92 and introduces the processing gas into the chamber 40 during processing. The gas exhaust 78 preferably comprises a servo control throttle valve 94 and a vacuum pump 96. The vacuum pump 96 evacuates the chamber 40 prior to processing. During processing, the vacuum pump 96 and the servo control throttle valve 94 maintain the desired pressure within the chamber 40 during processing.

The substrate support member 42 generally comprises a pedestal plate 44 disposed within a recess 46 on a top surface of a quartz insulator plate 48. The top surface 50 of the pedestal plate 44 extends slightly higher than the upper annular surface 52 of the quartz insulator plate 48 and is in contact with a central portion of the bottom surface or backside 58 of the substrate 54. Preferably, the pedestal plate 44 comprises titanium and is connected to a power source 80 to provide the necessary bias for processing. The peripheral portion of the substrate 54 extends above the upper annular surface 52 of the quartz insulator plate 48 and forms a gap 56 between the bottom surface 58 of the substrate 54 and the upper annular surface 52 of the quartz insulator plate 48. Preferably, the gap 56 has a height between about 5 mils and about 15 mils to prevent plasma from reaching the backside of the substrate. The outer edge of the upper annular surface 52 of the quartz insulator plate 48 has a diameter at least as great as the diameter of the outer edge of the substrate 54, and the backside 58 of the substrate 54 is practically covered.

A beveled portion 60 of the quartz insulator plate 48 extends from the outer edge of the upper annular surface 52 in a downward slope. Preferably, the slope of the bevel is between about 10 degrees and about 60 degrees from a horizontal plane. As shown in FIG. 2, the slope is about 45 degrees. Optionally, the substrate support member 42 includes a temperature controller or a heater (not shown) to control the temperature of the substrate during processing.

In operation, the substrate 54 is positioned on the substrate support member 42, and the chamber 40 is evacuated to provide a vacuum processing environment. A processing gas is introduced through the gas inlet 76 into the processing region 90. To activate the reaction, a plasma of the processing gas is generated in the processing region through inductive coupling and/or capacitive coupling. The initial plasma is preferably struck by biasing the substrate support member 42 between about 0.0032 W/cm$^2$ and about 0.32 W/cm$^2$, which corresponds to a RF power level between about 1 W and about 100 W for a 200 mm substrate, and between about 100 KHz and about 100 MHz for about 3 seconds. Alternatively, the initial plasma is generated by applying power to the inductive coil 98. During the reduction reaction period, the inductive coil 98 is biased between about 0.0032 W/cm$^2$ and about 3.2 W/cm$^2$ at between about 100 KHz and about 60 MHz to sustain a plasma in the processing region inductively while the substrate support member 42 is biased between about 0 W/cm$^2$ and about 0.32 W/cm$^2$ to sustain the plasma capacitively. Alternatively, during the reduction reaction period, the plasma in the processing region is sustained solely by the inductive coil 98. It is contemplated that the plasma within the processing region may be excited and sustained during processing by inductive coupling only, capacitive coupling only or combinations of both inductive and capacitive coupling.

The chamber pressure is initially built up to the desired processing pressure by setting the servo control throttle valve 94 to a partially closed state. During processing, the chamber pressure is preferably maintained between about 5 mTorr and about 100 mTorr by controlling the open/closed state of the servo control throttle valve 94. Optionally, the temperature of the substrate 54 during processing is controlled by a heater within the substrate support member 42.

Figure 2A:
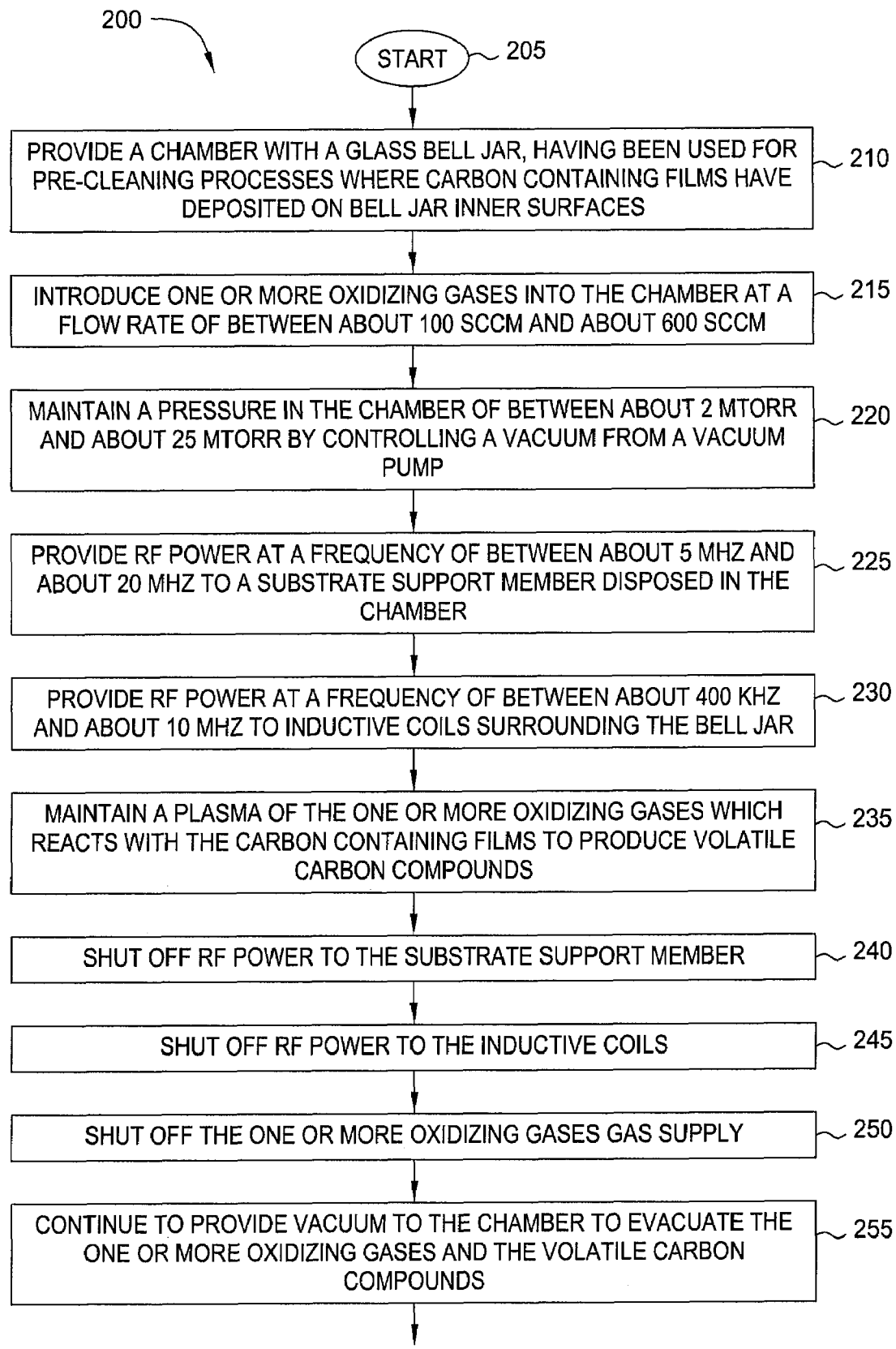
FIGS. 2A and 2B are a process flow diagram illustrating a method of cleaning a pre-cleaning chamber according to an embodiment of the invention.
Figure 2A:
Figure 2B:
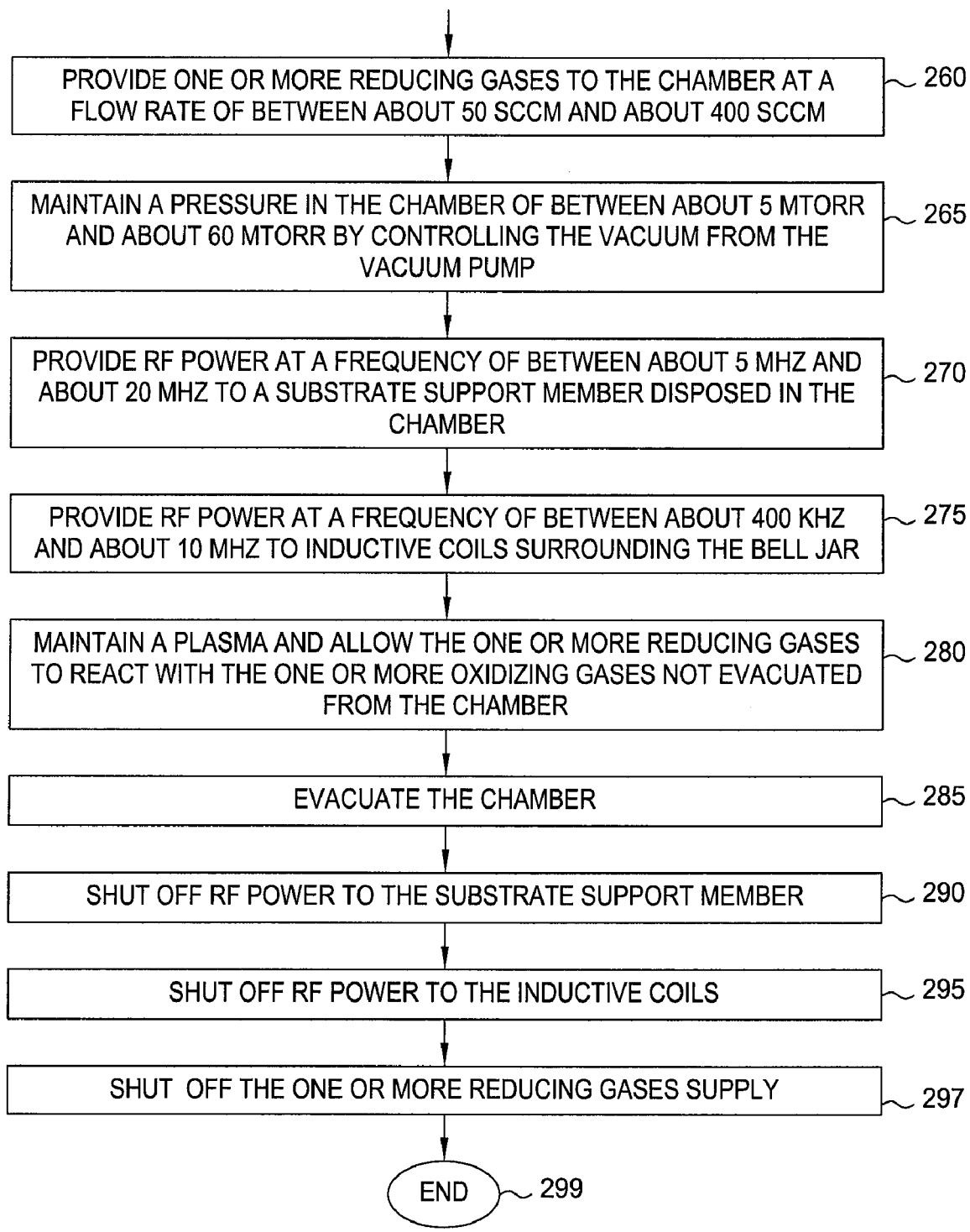
Figure 2B:

FIGS. 2A and 2B are a process flow diagram illustrating a method of cleaning a pre-cleaning chamber according to an embodiment of the invention. Carbon containing films are removed from the dielectric dome by exposing the films to a plasma of oxidizing gases. Process 200 starts at step 205 and proceeds to step 210. Step 210 provides the chamber with the dielectric dome which has been used for pre-cleaning processes resulting in carbon containing films being deposited on the inner surfaces of the dielectric dome. In step 215, one or more oxidizing gases are introduced into the chamber. The one or more oxidizing gases may be any gas that can oxidize the films deposited on dielectric dome to from a volatile product which can be pumped out of the chamber. The one or more oxidizing gases may include oxygen ($O_2$), ozone ($O_3$), nitrous oxide ($N_2O$), fluorine ($F_2$), chlorine ($Cl_2$), carbon monoxide (CO), carbon dioxide ($CO_2$), radicals thereof, derivatives thereof, and combinations thereof. The oxidizing gas may be introduced into the chamber at a flow rate of between about 0.3 sccm/cm$^2$ and about 1.9 sccm/cm$^2$, which corresponds to a flow rate between about 100 sccm and about 600 sccm for a 200 mm substrate. In one embodiment, the one or more oxidizing includes oxygen flowed at a flow rate of about 0.64 sccm/cm$^2$ (200 sccm for a 200 mm substrate). The one or more oxidizing gases may be introduced into the chamber with one or more inert gases, such as nitrogen, helium, or argon.

In step 220, the pressure in the chamber is maintained between about 2 mTorr and about 25 mTorr by controlling the open/closed state of the servo control throttle valve. In one embodiment, the pressure is maintained at about 10 mTorr. In step 225, an RF power at a frequency of between about 5 MHz and about 20 MHz is applied to the substrate support member disposed in the chamber. In one embodiment the frequency is about 13.6 MHz. In step 230, an RF power is provided at a frequency between about 400 kHz and about 10 MHz to the inductive coils surrounding the dome. In one embodiment the frequency is 2 MHz. The combination of the RF powers maintains a plasma of the one or more oxidizing gases which react with the carbon containing films to produce volatile carbon containing compounds (step 235) which may escape the chamber through the gas exhaust. The plasma may be maintained for between about 1 minute and about 10 minutes, or until most of, if not all of, the carbon containing films have been removed. In one embodiment the plasma is maintained for about 6 minutes. The time required to remove most of, if not all of, the carbon containing films may depend on how often the oxidizing plasma cleaning is performed. By more frequently performing the oxidizing plasma cleaning the shorter oxidizing plasma resident time is needed.

After the oxidizing gas plasma has reacted with most of, if not all, the carbon containing films, the plasma may be terminated. First, the RF power to the substrate support member may be shut off (step 240), and then the RF power to the inductive coils may be shut off (step 245). In step 250, the supply of the one or more oxidizing gases is shut off, and the one or more oxidizing gases and any volatile carbon containing gases are pumped out of the chamber through the gas exhaust (step 255). However, after step 255 some of the one or more oxidizing gases may still be adsorbed to the dielectric dome and other surfaces in the chamber.

The one or more oxidizing gases may be removed by initiating a plasma of reducing gases into the chamber. In step 260, one or more reducing gases are introduced into the chamber at a flow rate of between about 0.16 sccm/cm$^2$ (50 sccm for a 200 mm substrate) and about 1.3 sccm/cm$^2$ (400 sccm for a 200 mm substrate). Suitable reducing gases include silane ($SiH_4$), disilane ($Si_2H_6$), ammonia ($NH_3$), phosphine ($PH_3$), hydrazine ($N_2H_4$), diborane ($B_2H_6$), triethyl-borane ($Et_3B$), hydrogen ($H_2$), atomic hydrogen (H), radicals thereof, derivatives thereof, and combinations thereof. In one embodiment, the one or more reducing gases may be hydrogen. The one or more reducing gases may be introduced into the chamber with one or more inert gases, such as nitrogen, helium, or argon.

In step 265 the chamber pressure is maintained between about 5 mTorr and about 60 mTorr by controlling the open/closed state of the servo control throttle valve. In step 270, an RF power at a frequency of between about 5 MHz and about 20 MHz is applied to the substrate support member disposed in the chamber. In one embodiment the frequency is about 13.6 MHz. In step 275, an RF power is provided at a frequency between about 400 kHz and about 10 MHz to the inductive coils surrounding the dome. In one embodiment the frequency is 2 MHz. The combination of the RF powers maintains a plasma of the one or more reducing gases which react with the one or more oxidizing gases not evacuated from the chamber (step 280), and the product of the oxidizing gas/reducing gas reaction may be evacuated through the gas exhaust (step 285).

The reducing gas plasma may be maintained for between about 1 minute and about 10 minutes, or until most of, if not all of, the one or more oxidizing gases have reacted with the one or more reducing gases. In one embodiment the plasma is maintained for about 5 minutes.

In one embodiment the one or more oxidizing gases may be oxygen and the one or more reducing gases may be hydrogen. The hydrogen plasma reacts with any oxygen gas still present in the chamber to form water vapor which may escape the chamber through the gas exhaust. The hydrogen gas may be introduced into the chamber with an inert gas, and in one embodiment the reducing gas mixture comprises between 0.1% and 100% hydrogen. For safety reasons, the reducing gas mixture may comprise about 5% or less hydrogen premixed with an inert carrier gas such as helium. In one embodiment, the mixture is flowed at a flow rate of about 0.26 sccm/cm$^2$ (82 sccm for a 200 mm substrate).

After the reducing gas plasma has reacted with most of, if not all, the one or more oxidizing gases, the plasma may be terminated. First, the RF power to the substrate support member may be shut off (step 290), and then the RF power to the inductive coils may be shut off (step 295). In step 297, the supply of the one or more reducing gases is shut off, and while continuously providing vacuum from the vacuum pump. The process stops at step 299.

EXAMPLE

Figure 3A:
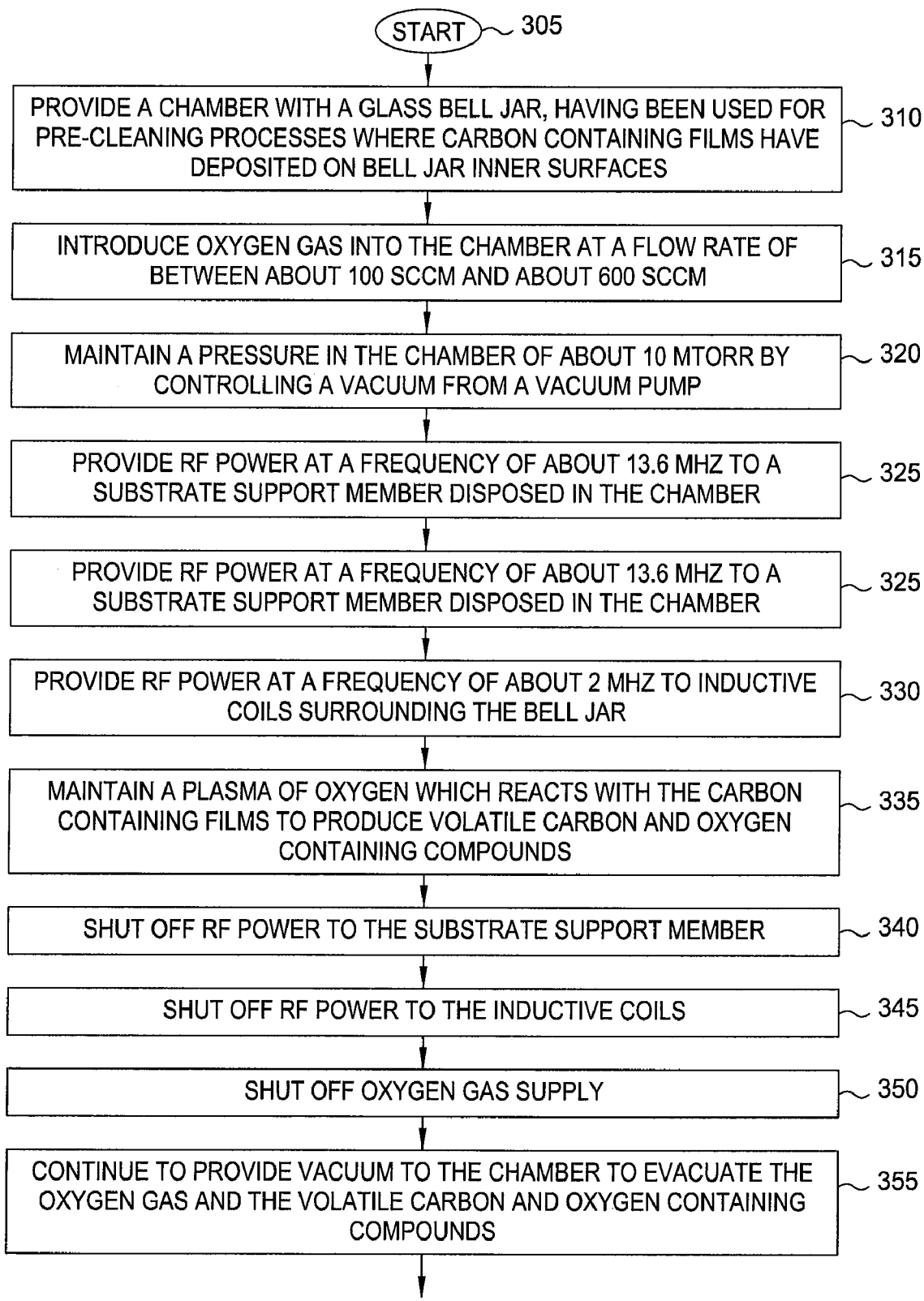
FIGS. 3A and 3B are a process flow diagram illustrating an example of a method of cleaning a pre-cleaning chamber according to an embodiment of the invention.
Figure 3B:
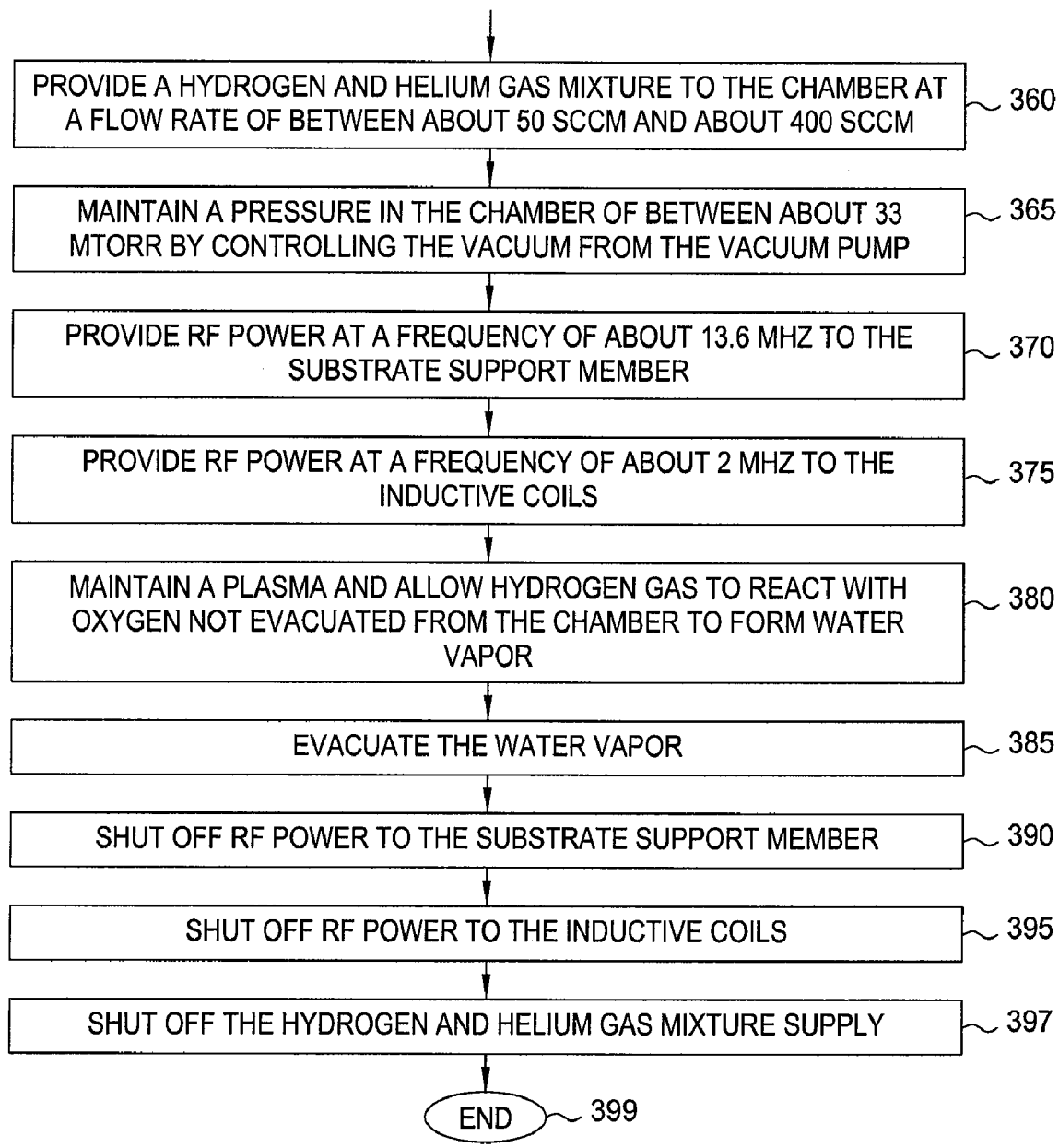

FIGS. 3A and 3B are a process flow diagram illustrating an example of a method of cleaning a pre-cleaning chamber according to an embodiment of the invention. Carbon containing films were removed from a chamber having a glass dome by exposing the films to a plasma of oxygen gas according to process 300. Process 300 starts at step 305 and proceeds to step 310. Step 310 provides the chamber having a glass dome. The chamber has repeatedly been used in substrate pre-clean processes of 200 mm substrates, resulting in the carbon containing films depositing on the glass bell dome. Typically, such a glass dome is part of a kit which may be removed for manual cleaning or exchanged after having been used for pre-cleaning about 2000 substrates.

In step 315, oxygen is introduced into the chamber at a flow rate of about 200 sccm. In step 320, the pressure in the chamber is maintained at about 10 mTorr. In step 325, an RF power at a frequency of about 13.6 is applied to the substrate support member disposed in the chamber. In step 330, an RF power is provided at a frequency of about 2 MHz to the inductive coils surrounding the dome. The combination of the RF powers maintains a plasma of the oxygen gas which reacts with the carbon containing films to produce volatile carbon and oxygen containing compounds (step 335) which may escape the chamber through the gas exhaust. The plasma is maintained for about 6 minutes.

In step 340, the RF power to the substrate support member is then shut off followed shutting off the RF power to the inductive coils (step 345). In step 350, the supply of the oxygen gas is shut off, and the oxygen gas and any volatile carbon and oxygen containing gases are pumped out of the chamber through the gas exhaust (step 355).

In step 360, gas mixture comprising 5% hydrogen and 95% helium is introduced into the chamber at a flow rate of about 82 sccm. The chamber pressure is maintained at about 33 mTorr (step 365). In step 370, an RF power at a frequency of about 13.6 MHz is applied to the substrate support member disposed in the chamber. In step 375, an RF power is provided at a frequency of about 2 MHz to the inductive coils surrounding the dome. The combination of the RF powers maintains a plasma of the hydrogen gas which react with the oxygen gas not evacuated from the chamber to form water vapor (step 380) and the water vapor is evacuated through the gas exhaust (step 385).

After 5 minutes, the plasma is terminated. First, the RF power to the substrate support member is be shut off (step 390), and then the RF power to the inductive coils is be shut off (step 395). In step 397, the oxygen supply is shut off while continuously providing vacuum from the vacuum pump to evacuate the chamber. The process stops at step 399.

By performing process 300 after a predetermined number of substrates have been pre-cleaned in the chamber, the kit life of the glass dome increases from about 2000 substrates processed to at least about 8000 substrates processed, resulting in savings on valuable time that the chamber is inoperable due to kit exchange and manual cleaning.

While the foregoing is directed to embodiments of the present invention, other and further embodiments of the invention may be devised without departing from the basic scope thereof, and the scope thereof is determined by the claims that follow.

The invention claimed is:

1. A method of cleaning a process chamber, comprising:
providing a process chamber having carbon deposits on inner surfaces of a dielectric dome;
introducing a first gas comprising one or more oxidizing gases into the process chamber at a flow rate of between about 0.32 sccm/cm$^2$ and about 1.9 sccm/cm$^2$ while maintaining a first pressure in the process chamber of between about 2 mTorr and about 25 mTorr;
providing a first RF power at a frequency of between about 5 MHz and about 20 MHz to a substrate support member disposed in the process chamber and providing a second RF power at a frequency of between about 400 KHz and about 10 MHz to inductive coils surrounding the dielectric dome while maintaining a plasma of the first gas to react the one or more oxidizing gases with the carbon deposits to produce volatile compounds comprising carbon;
terminating the first RF power, second RF power, and the first gas;
introducing a second gas comprising one or more reducing gases to the process chamber at a flow rate of between about 0.16 sccm/cm$^2$ and about 1.3 sccm/cm$^2$, while maintaining a second pressure in the process chamber of between about 5 mTorr and about 60 mTorr;
providing the first RF power at a frequency of between about 5 MHz and about 20 MHz to the substrate support member and providing the second RF power at a frequency of between about 400 KHz and about 10 MHz to the inductive coils while maintaining a plasma of the second gas to react the one or more reducing gases with the one or more oxidizing gases not evacuated from the process chamber;
evacuating the chamber; and
terminating the first RF power, the second RF power, and the second gas.

2. The method of claim 1, wherein the one or more oxidizing gases is selected from the group consisting of oxygen, ozone, nitrous oxide, fluorine, chlorine, carbon monoxide, carbon dioxide, radicals thereof, derivatives thereof, and combinations thereof.

3. The method of claim 2, wherein the one or more reducing gases is selected from the group consisting of silane, disilane, ammonia, phosphine, hydrazine, diborane, triethylborane, hydrogen, atomic hydrogen, radicals thereof, derivatives thereof, and combinations thereof.

4. The method of claim 3, wherein the one or more oxidizing gases is oxygen and the one or more reducing gases is hydrogen.

5. The method of claim 4, wherein the second gas further comprises helium.

6. The method of claim 1, wherein the first gas has a flow rate of about 0.64 sccm/cm$^2$.

7. The method of claim 6, wherein the second gas has a flow rate of about 0.26 sccm/cm$^2$.

8. The method of claim 1, wherein the first pressure is maintained at between about 5 mTorr and about 15 mTorr.

9. The method of claim 8, wherein the second pressure is maintained at between about 25 mTorr and about 40 mTorr.

10. The method of claim 1, wherein the plasma of the first gas and the plasma of the second gas are maintained for between about 1 minute and 10 minutes.

11. The method of claim 10, wherein the plasma of the first gas is maintained for about 6 minutes.

12. The method of claim 1, wherein the first RF power is maintained at a frequency of about 13.6 MHz.

13. The method of claim 12, wherein the second RF power is maintained at a frequency of about 2 MHz.

14. A method of cleaning a process chamber, comprising:
providing a process chamber having carbon deposits on inner surfaces of a dielectric dome;
introducing a first gas comprising oxygen into the process chamber at a flow rate of between about 0.32 sccm/cm$^2$ and about 1.9 sccm/cm$^2$ while maintaining a first pressure in the process chamber of between about 2 mTorr and about 25 mTorr;
providing a first RF power at a frequency of about 13.6 MHz to a substrate support member disposed in the process chamber and providing a second RF power at a frequency of about 2 MHz to inductive coils surrounding the dielectric dome while maintaining a plasma of the first gas to react the first gas with the carbon deposits to produce volatile compounds comprising carbon;
terminating the first RF power, second RF power, and the first gas;
introducing a second gas comprising hydrogen to the process chamber at a flow rate of between about 0.16 sccm/cm$^2$ and about 1.3 sccm/cm$^2$, while maintaining a second pressure in the process chamber of between about 5 mTorr and about 60 mTorr;
providing the first RF power at a frequency of about 13.6 MHz to the substrate support member and providing the second RF power at a frequency of about 2 MHz to the inductive coils while maintaining a plasma of the second gas to react the second gas with the first gas not evacuated from the process chamber;
evacuating the chamber; and
terminating the first RF power, the second RF power, and the second gas.

15. The method of claim 14, wherein the second gas further comprises helium.

16. The method of claim 14, wherein the first gas has a flow rate of about 200 sccm.

17. The method of claim 16, wherein the second gas has a flow rate of about 82 sccm.

18. The method of claim 14, wherein the first pressure is maintained at between about 5 mTorr and about 15 mTorr.

19. The method of claim 18, wherein the second pressure is maintained at between about 25 mTorr and about 40 mTorr.

20. The method of claim 14, wherein the plasma of the first gas and the plasma of the second gas are maintained for between about 1 minute and 10 minutes.

21. The method of claim 20, wherein the plasma of the first gas is maintained for about 6 minutes.

22. A method of cleaning a process chamber, comprising:

provided a process chamber having carbon deposits on inner surfaces of a dielectric dome;

introducing a first gas comprising oxygen into the process chamber at a flow rate of between about 0.32 sccm/cm$^2$ and about 1.9 sccm/cm$^2$ while maintaining a first pressure in the process chamber of between about 2 mTorr and about 25 mTorr;

providing a first RF power at a frequency of about 13.6 MHz to a substrate support member disposed in the process chamber and providing a second RF power at a frequency of about 2 MHz to inductive coils surrounding the dielectric dome while maintaining a plasma of the first gas to react the first gas with the carbon deposits for between about 1 minute and about 10 minutes to produce volatile compounds comprising carbon;

terminating the first RF power, second RF power, and the first gas;

introducing a second gas comprising hydrogen to the process chamber at a flow rate of between about 0.16 sccm/cm$^2$ and about 1.3 sccm/cm$^2$, while maintaining a second pressure in the process chamber of between about 5 mTorr and about 60 mTorr;

providing the first RF power at a frequency of about 13.6 MHz to the substrate support member and providing the second RF power at a frequency of about 2 MHz to the inductive coils while maintaining a plasma of the second gas to react the second gas with the first gas not evacuated from the process chamber for between about 1 minute and about 10 minutes;

evacuating the chamber; and terminating the first RF power, the second RF power, and the second gas.

* * * * *